United States Patent [19]
Lau et al.

[11] Patent Number: 5,292,189
[45] Date of Patent: Mar. 8, 1994

[54] SUB-PANEL GUIDE SYSTEM FOR ELECTRICAL ENCLOSURE

[75] Inventors: Robert G. Lau, Anoka; Trent T. Jones, White Bear Lake; Jeffrey A. Earles, Rochester, all of Minn.

[73] Assignee: Federal-Hoffman, Inc., Anoka, Minn.

[21] Appl. No.: 799,339

[22] Filed: Nov. 27, 1991

[51] Int. Cl.⁵ .......................................... A47B 47/00
[52] U.S. Cl. ............................ 312/265.3; 312/334.6; 312/334.29; 361/724
[58] Field of Search ............ 312/334.6, 334.28, 334.29, 312/265.1, 265.3, 265.6; 361/331, 346, 359, 391, 415, 427, 428, 429

[56] References Cited

U.S. PATENT DOCUMENTS

| | | | |
|---|---|---|---|
| 4,689,722 | 8/1987 | Debus et al. | 361/391 |
| 4,958,259 | 9/1990 | Berg et al. | 361/429 |

FOREIGN PATENT DOCUMENTS

| | | | |
|---|---|---|---|
| 0273174 | 5/1964 | Australia | 361/429 |
| 3821016 | 1/1989 | Fed. Rep. of Germany | 361/427 |

OTHER PUBLICATIONS pp. 279–280 of Hoffman Engineering Company's Feb. 1988 catalog Picture of Hoffman Engineering Company sub-panel connector member.

Primary Examiner—Kenneth J. Dorner
Assistant Examiner—Gerald A. Anderson
Attorney, Agent, or Firm—Schroeder & Siegfried

[57] ABSTRACT

A system for installing and properly positioning a sub-panel mounting board within a freestanding electrical enclosure, wherein the base sections of the enclosure frame form a continuous rectangular guide channel around the inner periphery of the enclosure which is designed to receive in opposite parallel channel segments thereof a pair of channel followers that are connected to opposite lower corners of the mounting board. Each channel follower has a depending leg which extends into its respective channel segment and supports the mounting board during installation thereof. The depending leg of each channel follower engages the bottom of the channel when the mounting board is tilted forward for installation within the enclosure. Once the mounting board is installed and positioned upright, each channel follower rests upon a mounting flange formed by the enclosure frame, thereby allowing the mounting board to be secured thereto. Each channel follower further includes a depending locking lug which extends into the rearmost cross channel section when the mounting board is positioned such that each channel follower is in its rearmost position within the channel segment in which it travels. In such position, the mounting board is automatically locked in place by the locking lug, thereby preventing any movement thereof.

14 Claims, 6 Drawing Sheets

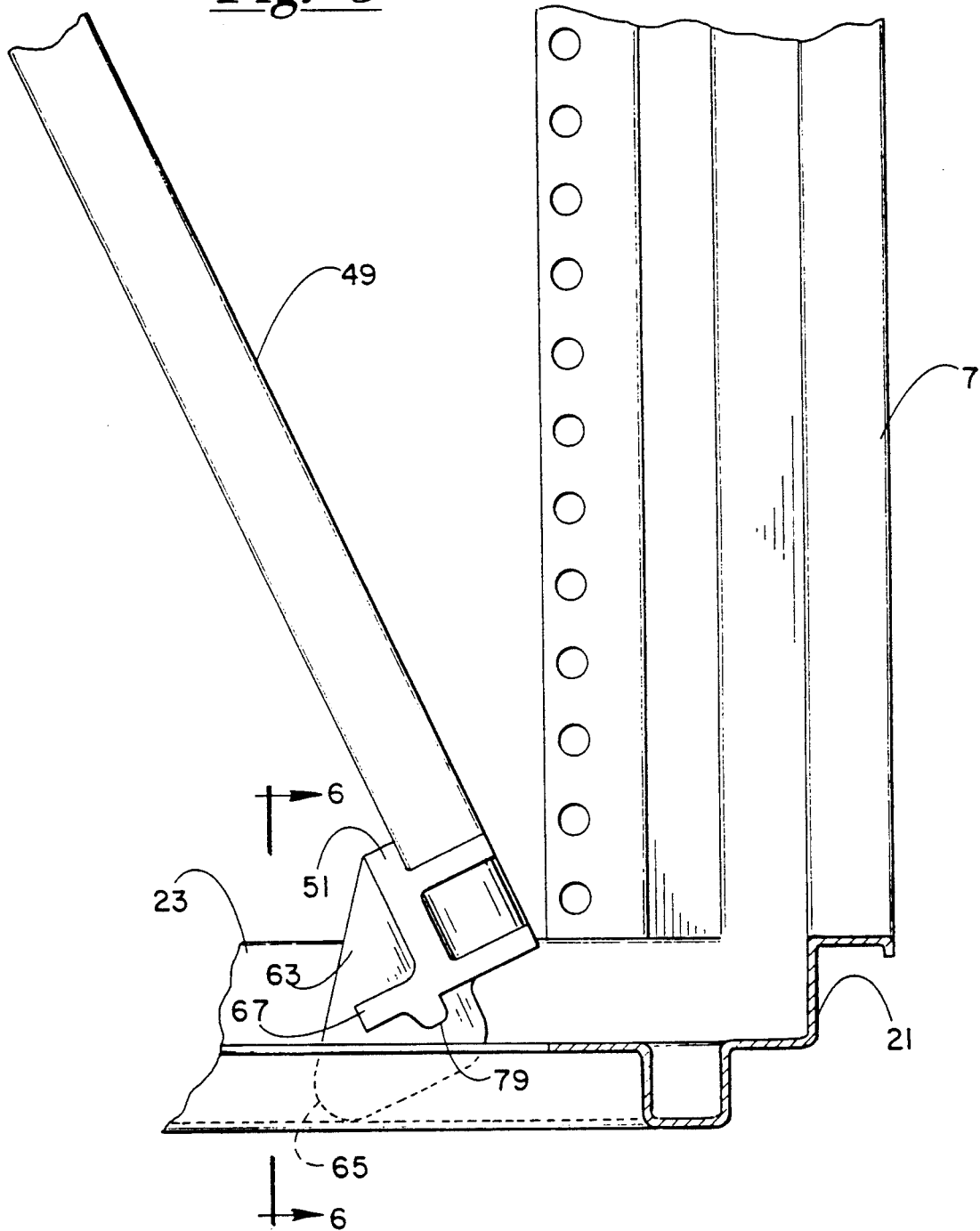

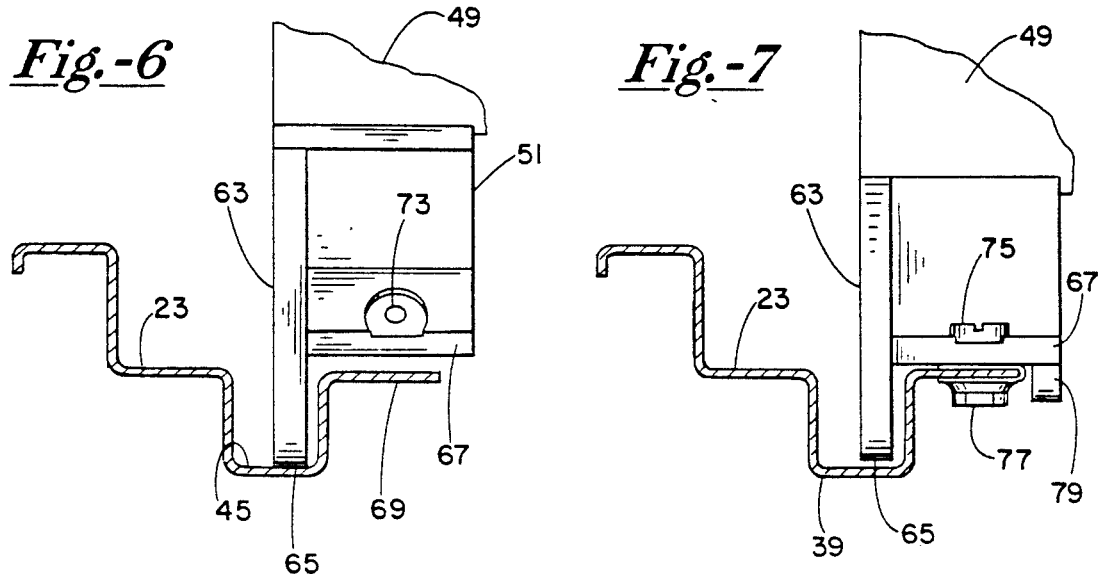
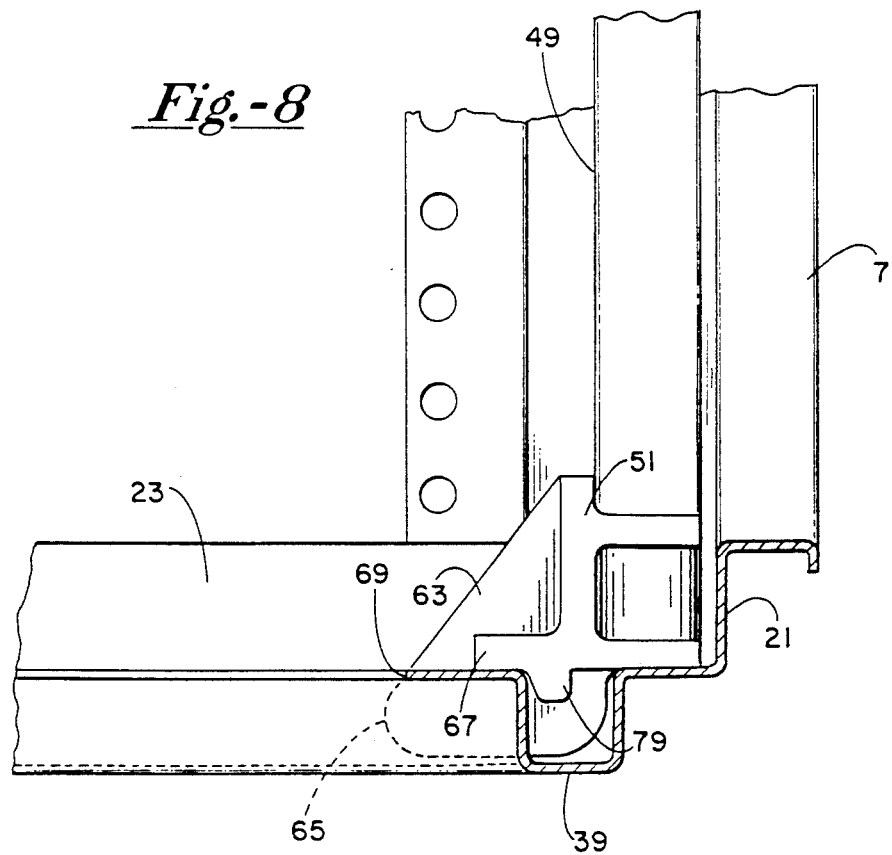

SUB-PANEL GUIDE SYSTEM FOR ELECTRICAL ENCLOSURE

BACKGROUND OF INVENTION

Enclosure systems as in the type described herein are generally used in connection with large and/or small electrical switchboard systems, and are commonly used to house a plurality of interior mounting boards and accessories for holding electrical components, etc. Such enclosures may or may not require environmental control therewithin, and are generally filled to maximum capacity with such components and other accessories.

Environmental enclosures of this type are used for a wide variety of purposes. As such, it has become increasingly important in manufacturing such enclosures that the manufacturer be able to meet the changing demands of its customers and provide an enclosure which is highly versatile, efficient to use, and readily accessible to the interior thereof.

The interiors of such electrical enclosures must frequently be accessed. Thus, it is important to minimize the effort necessary for doing so. Because of the overcrowding of such electrical enclosures, it is often necessary to remove various components and sub-panels from within the same in order to make the enclosure more accessible. Sub-panel mounting boards which carry various components and other accessories are often removed and reinstalled, as necessary. For example, many conventional electrical enclosures must be accessed from the interior thereof in order to remove the various wall panels for restructuring purposes. In such case, it is frequently necessary to remove the various sub-panels from the interior thereof in order to access the necessary hardware for removing such panels. Also, the interiors of such enclosures often need to be accessed to repair various components and accessories, which requires removal of one or more sub-panels.

For the above reasons, there is a distinct need for an enclosure with easily removable sub-panel mounting boards that can be installed, removed and repositioned with relative ease to minimize time and labor associated therewith. This must be accomplished while maintaining high versatility and economy in manufacturing the same.

One conventional enclosure, which is the subject of U.S. Pat. No. 4,689,722, discloses a sub-panel guide system which uses a pair of separately installed guide rails upon which a pair of slotted guide blocks, which are attached to the sub-panel mounting board, may travel. Because of the weight of such mounting boards, such a system is difficult to properly align with the slotted guide blocks riding on their respective rails. As such, installation thereof is more time consuming and labor intensive. Moreover, this system only provides for unidirectional installation of such mounting boards, which significantly reduces the versatility thereof.

By contrast, the sub-panel guide system which we have developed is highly versatile in that it receives such mounting boards in a plurality of orientations, and provides a readily accessible integrally formed guide channel for easy alignment and installation thereof. These advantages and more will become readily apparent from the following disclosure of our unique sub-panel guide system.

BRIEF SUMMARY OF THE INVENTION

It is the purpose of this invention to provide a means by which sub-panel mounting boards may be easily installed and positioned in a plurality of orientations within the confines of an electrical enclosure. Towards this end, the instant invention includes an enclosure frame which defines a continuous rectangular guide channel around the inner periphery of the lower base portion thereof. Preferably, but not necessarily, the guide channel is integrally formed from the lower base frame sections, which significantly reduces the time, labor and cost of manufacturing the sub-panel guide system.

Attached at the lower corners of each sub-panel mounting board is a channel follower or guide traveler which supports and guides the sub-panel mounting board within the various parallel channel segments of the rectangular guide channel formed in the base of the enclosure frame. Each channel follower is mounted upon a mounting board in corresponding spaced relation relative to the space between opposite parallel channel segments of the rectangular guide channel. Each channel follower includes a depending leg which extends downwardly and forwardly of the mounting surface of the sub-panel mounting board, and converges to an apex which engages the lower surface of the guide channel upon installation of the sub-panel mounting board within the enclosure.

To install the sub-panel mounting board within the enclosure, the mounting board is tilted forwardly, thereby causing each channel follower to tilt forward, such that the apex of each depending leg contacts the lower surface of the channel segment within which it travels. Such engagement between each channel follower and its respective channel segment permits slideable movement along the length thereof. The mounting board may then be slid rearwardly into the enclosure to a predetermined desired location, where it is returned to an upright position for securement within the enclosure.

The rectangular guide channel includes a continuous interior mounting flange which has a plurality of spaced mounting holes therein. Upon returning the sub-panel mounting board to an upright position, each channel follower, which includes a mounting shoulder having an aperture therein, seats upon the mounting flange adjacent to the channel segment within which it travels. By lining up the aperture in the mounting shoulder of each channel follower with a mounting hole in an associated mounting flange, the mounting board may be secured, via the use of a conventional bolt, in any desired position within the enclosure.

Each channel follower also includes a depending locking lug which is designed to extend within the rearmost transverse channel segment when the mounting board is positioned in the rearmost position within the enclosure. Each depending locking lug automatically self-locks the mounting board and prevents any slidable movement of the channel followers within the respective channel segments in which they travel.

Because of the rectangular continuous structure of the guide channel formed within the enclosure, a sub-panel mounting board may be installed in a plurality of orientations therewithin. From a typical forward mounting position, a sub-panel mounting board may be rotated in full 90° increments to provide sideways mounting or rear-faced mounting thereof. Such a design not only enhances the versatility and options for the user thereof, but also reduces time, labor and cost involved in the use and manufacture of such enclosures.

BRIEF DESCRIPTION OF THE DRAWINGS

These and other objects and advantages of the invention will more fully appear from the following description, made in connection with the accompanying drawings, wherein like reference characters refer to the same or similar parts throughout the several views, and in which:

FIG. 5 is a fragmentary side vertical sectional view taken through the center of a modular enclosure frame similar to that shown in FIG. 1B, showing the manner in which a sub-panel mounting board is installed within the enclosure frame via the use of our unique sub-panel guide system;

FIG. 6 is a fragmentary vertical sectional view taken along lines 6—6 of FIG. 5, illustrating how the mounting board and channel followers are tilted forward so as to glide within the integral sub-panel guide system of the enclosure frame;

FIG. 7 is a fragmentary vertical sectional view taken through one of the lower sections of the modular enclosure frame similar to that shown in FIG. 1B, illustrating how the channel followers are secured to the enclosure frame after the sub-panel mounting board is installed therein; and FIG. 8 is a fragmentary side vertical sectional view taken through the center of a modular enclosure frame embodying our unique sub-panel guide system, showing a sub-panel mounting board in its self-locking rearmost position within the enclosure.

DETAILED DESCRIPTION OF THE INVENTION

Figure 1A:
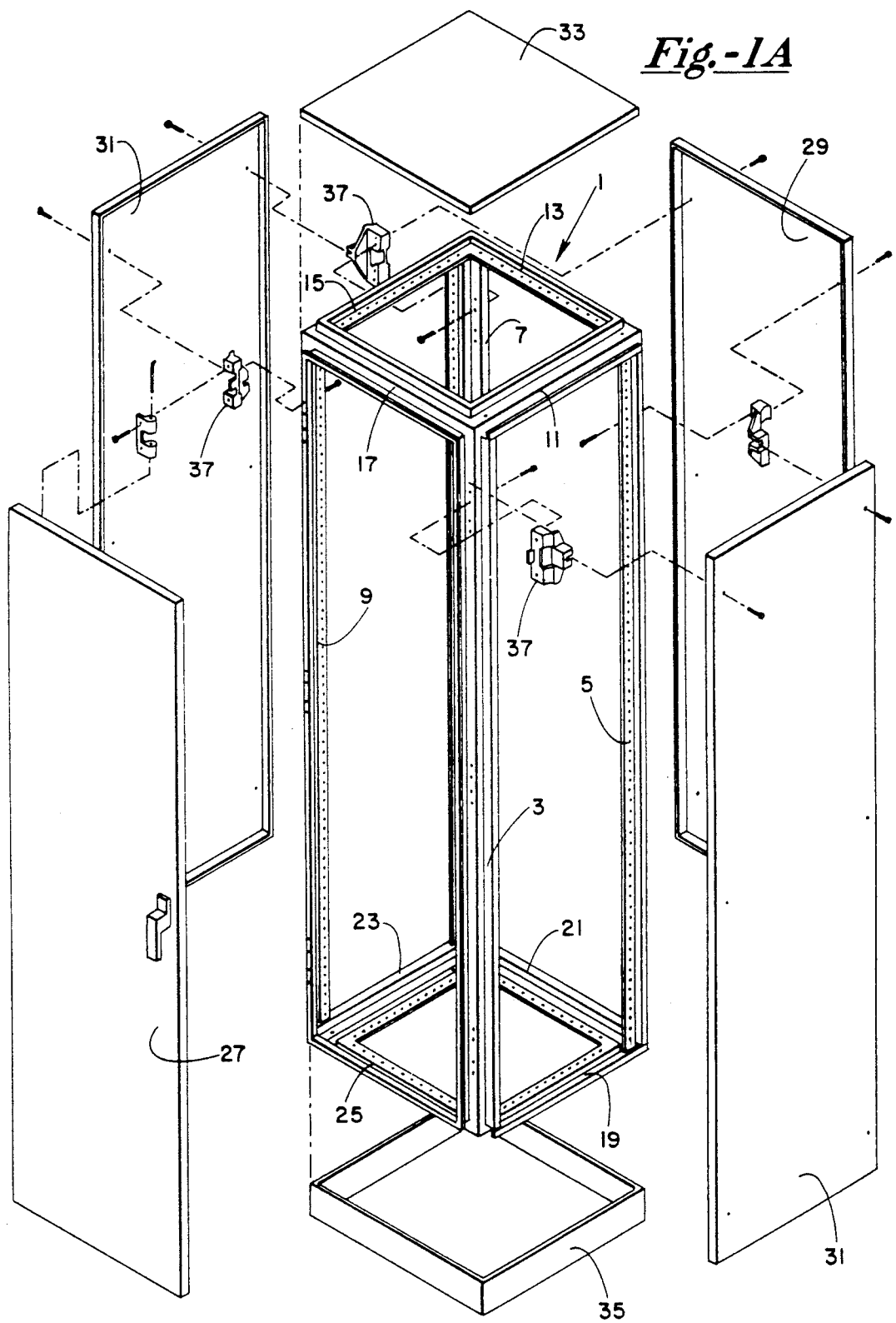
FIG. 1A is a perspective view of an electrical enclosure frame incorporating our unique sub-panel guide system, and showing the various exterior enclosure panels exploded therefrom.

Shown in FIG. 1A of the drawings is a free standing multi-faceted enclosure frame which defines a plurality of top, bottom and side openings. Modular frame 1 comprises a plurality of vertically upstanding corner frame sections 3, 5, 7, and 9 which are interconnected at their top ends by upper cross frame sections 11, 13, 15, and 17, and at their lower ends by lower cross frame sections 19, 21, 23, and 25. The openings defined by enclosure frame 1 are constructed to receive thereover a front door panel 27, a rear wall panel 29, a pair of side panels 31, a top panel 33 and a bottom base stand 35. Each of the various door and wall panels of the enclosure are designed to be secured to the enclosure frame 1 via a plurality of multi-purpose mounting blocks 37, the construction and function of which are the subject of co-pending patent application Ser. No. 07/799,547, enttitled RESTRUCTURABLE ENCLOSURE WITH MULTI-PURPOSE MOUNTING BLOCKS, the contents of which are incorporated herein by reference thereto.

Each frame section of enclosure frame 1 is designed with the identical cross-sectional configuration, and has been engineered to cooperatively mate with adjacent frame sections at each corner of the enclosure. As such, adjoining frame sections can be mitered and easily welded together to form integral corners, thereby avoiding the need for the use of corner adapters, which are frequently used to connect intersecting frame sections of conventional enclosures. The specific construction and function of each frame section of modular enclosure frame 1 is also the subject of a co-pending patent application Ser. No. 07/799,408, entitled MULTI-FACETED MODULAR ENCLOSURE FRAME WITH INTEGRAL SUB-PANEL GUIDE SYSTEM, the contents of which are incorporated herein by reference thereto.

As noted previously and shown in FIG. 1B, enclosure frame 1 includes a unique sub-panel guide system which is preferably, but not necessarily, integrally formed therewith. Lower base frame sections 19, 21, 23, and 25 form an integral channel member 39 which is defined by a pair of legs 41 and 43 that are interconnected at their lower ends by webbed portion 45. Upon completing the assembly of modular frame 1, lower frame sections 19, 21, 23, and 25 define a continuous integral generally rectangular guide channel 47, which extends around the inner periphery of the base of the modular enclosure frame 1.

Figure 1B:
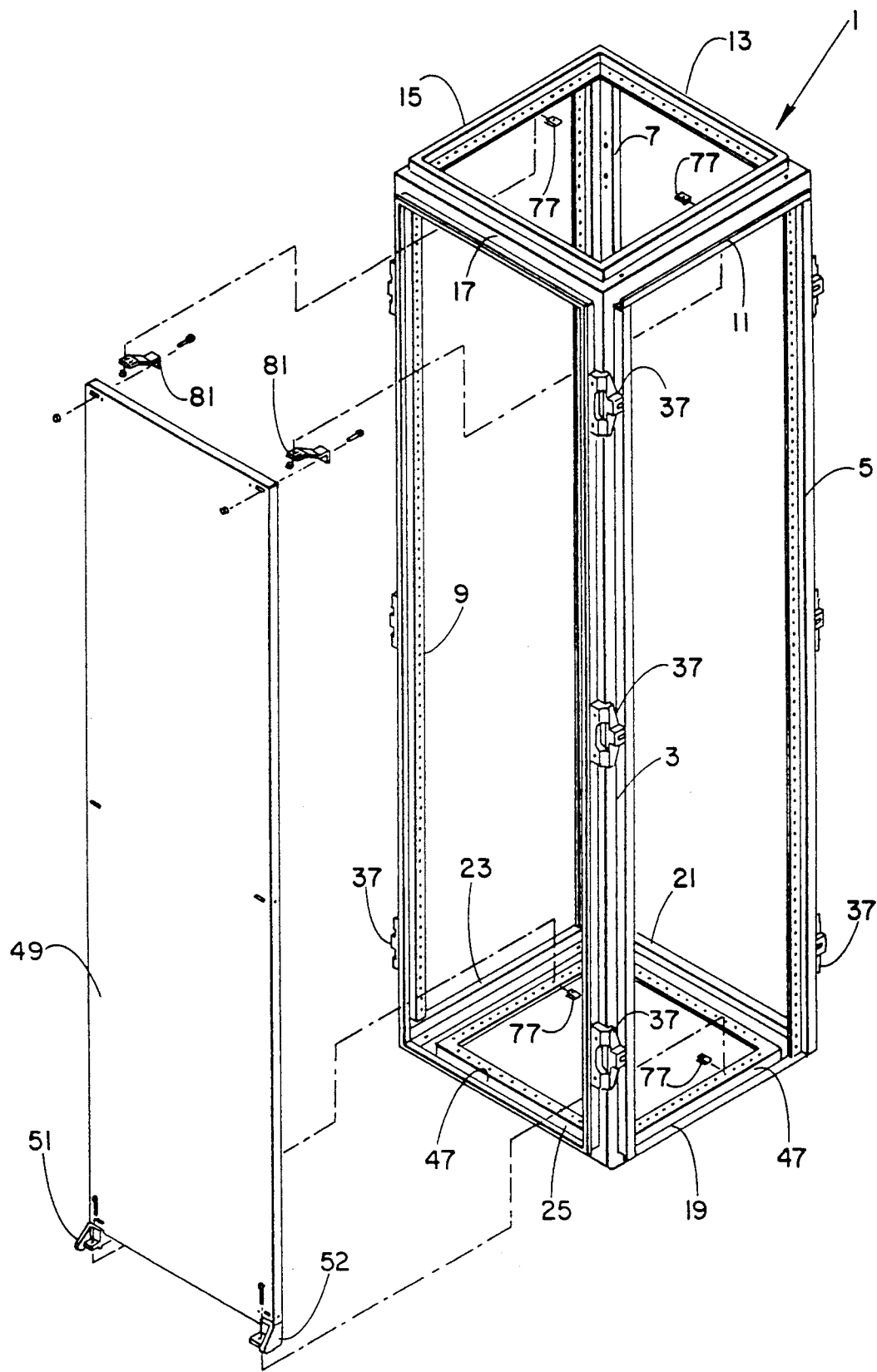
FIG. 1B is a perspective view of an electrical enclosure frame with a sub-panel mounting board exploded therefrom, showing our unique sub-panel guide system which provides ease in the installation of the mounting board.

As shown best in FIG. 1B, modular enclosure frame 1 is designed to receive therein one or more sub-panel mounting boards 49. Mounting board 49 is constructed with dimensions such that it is capable of being cooperatively received within the interior confines defined by modular frame 1. Mounting board 49 carries a pair of channel followers or guide travelers 51 and 52 at its lower end which mate cooperatively with opposite parallel channel segments of rectangular guide channel 47 so as to guide mounting board 49 for proper installation within enclosure frame 1. Channel follower 51 is carried by the lower left corner of mounting board 49, and channel follower 52 is carried by the lower right corner thereof. As can be seen in FIG. 1B, each channel follower is constructed identically as the mirror image of the other.

Figure 3:
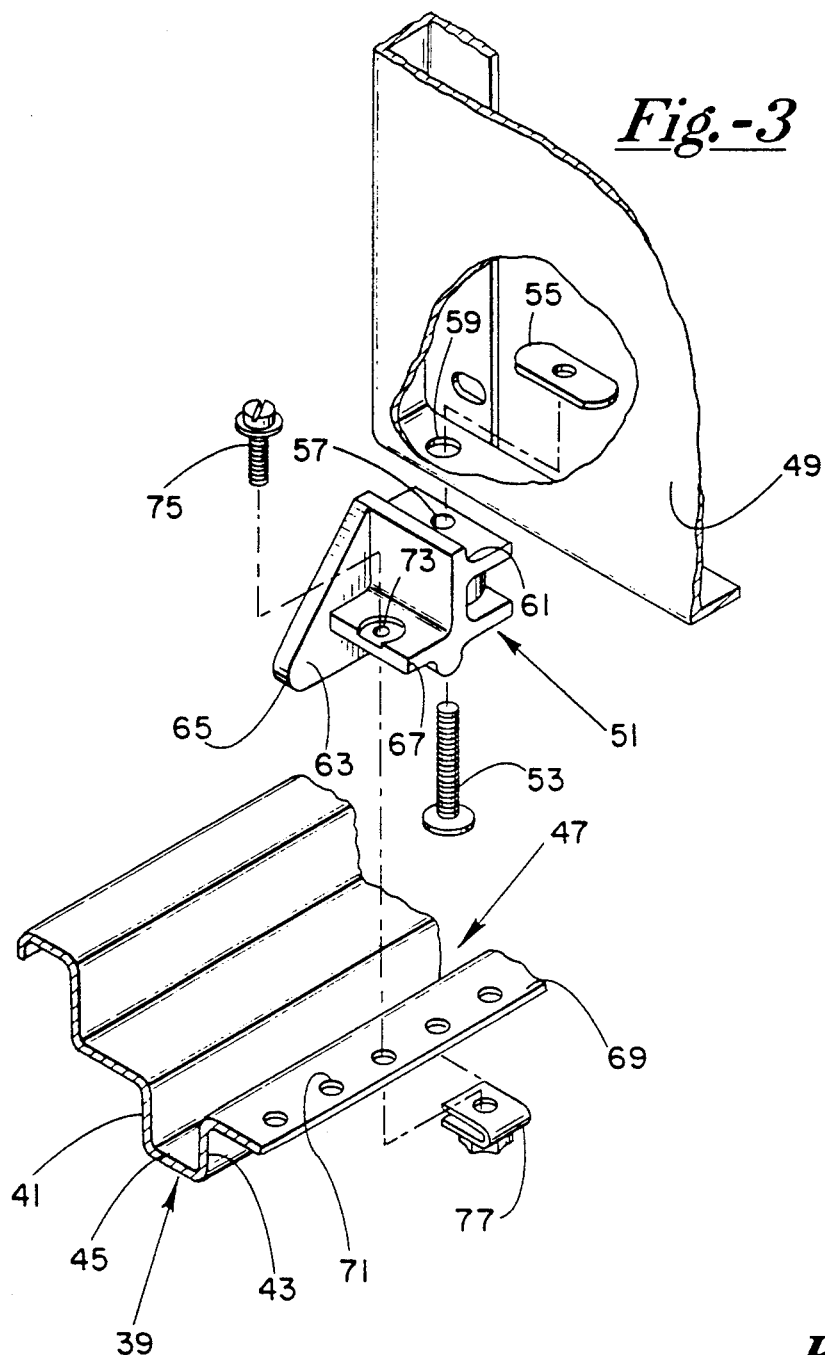
FIG. 3 a fragmentary exploded perspective view of one of the lower base sections of a modular enclosure frame similar to that shown in FIG. 1B, showing the integral sub-panel guide system formed therein and the manner in which it receives a channel follower that is mounted on the sub-panel mounting board.

As illustrated in FIG. 3, each channel follower 51 and 52 is connected to its respective lower corner of mounting board 49 via a bolt 53 and a locking nut 55. Bolt 53 extends through aperture 57 in channel follower 51, and through opening 59 in the lower end of mounting board 49, where it receives locking nut 55 to fixedly secure the same thereto. Channel follower 52 is connected to mounting board 49 in the same manner.

Figure 4:
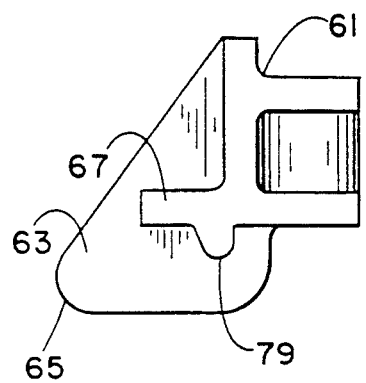
FIG. 4 is a side elevational view of one of the channel followers which are mounted on a sub-panel mounting board.

Each channel follower 51 and 52 is constructed of a polymeric material, preferably polyamide, 43% fiberglass reinforced to insure adequate strength and support for the sub-panel mounting board which it carries. As shown in FIG. 4, channel followers 51 and 52 each have an enlarged depending traveler leg 63 which extends downwardly and forwardly from the outer mounting surface of sub-panel mounting board 49. More specifically, as can be seen in FIGS. 3 and 4, depending traveler leg 63 angles downwardly and forwardly from corner 61 to form an apex or lower bearing surface 65. Corner 61 marks the point where the lower front corners of mounting board 49 seat against the respective channel followers 51 and 52.

Each channel follower 51 and 52 also includes a mounting shoulder 67 which is constructed to seat and rest upon mounting flange 69, which is formed by each of the lower cross frame sections 19, 21, 23, and 25. Mounting flange 69 is cantilevered normally inward from leg 43 of channel member 39, and is coextensive therewith so as to form a continuous mounting surface around the inner periphery of the lower cross frame sections of modular frame 1. Mounting flange 69 has a plurality of mounting holes 71 extending therethrough which are designed for cooperative alignment with aperture 73 in mounting shoulder 67 of each channel follower 51 and 52. As illustrated best in FIG. 3, each channel follower 51 and 52 may be secured at any desired position along mounting flange 69 via the use of a conventional bolt 75 which extends through aperture 73 in mounting shoulder 67, and into clip nut 77, which straddles mounting flange 69 in cooperative alignment with an associated mounting hole 71.

As shown in FIG. 1B, in one orientation, mounting board 49 can be arranged to extend between lower cross frames sections 19 and 23. In such case, depending traveler leg 63 of channel follower 51 extends into channel member 39 of lower cross frame section 23. Depending traveler leg 63 of channel follower 52 similarly extends into guide channel 39 of lower cross frame section 19. In such manner, channel followers 51 and 52 glide within opposite parallel channel segments of guide channel 47, which are formed by lower cross frame sections 19 and 23. As is evident from FIG. 1B, mounting board 49 could be similarly mounted in a reverse rear-facing orientation by simply turning the mounting board 180° such that channel followers 51 and 52 ride within the channel members 39 of lower cross frame sections 19 and 23, respectively.

Figure 2:
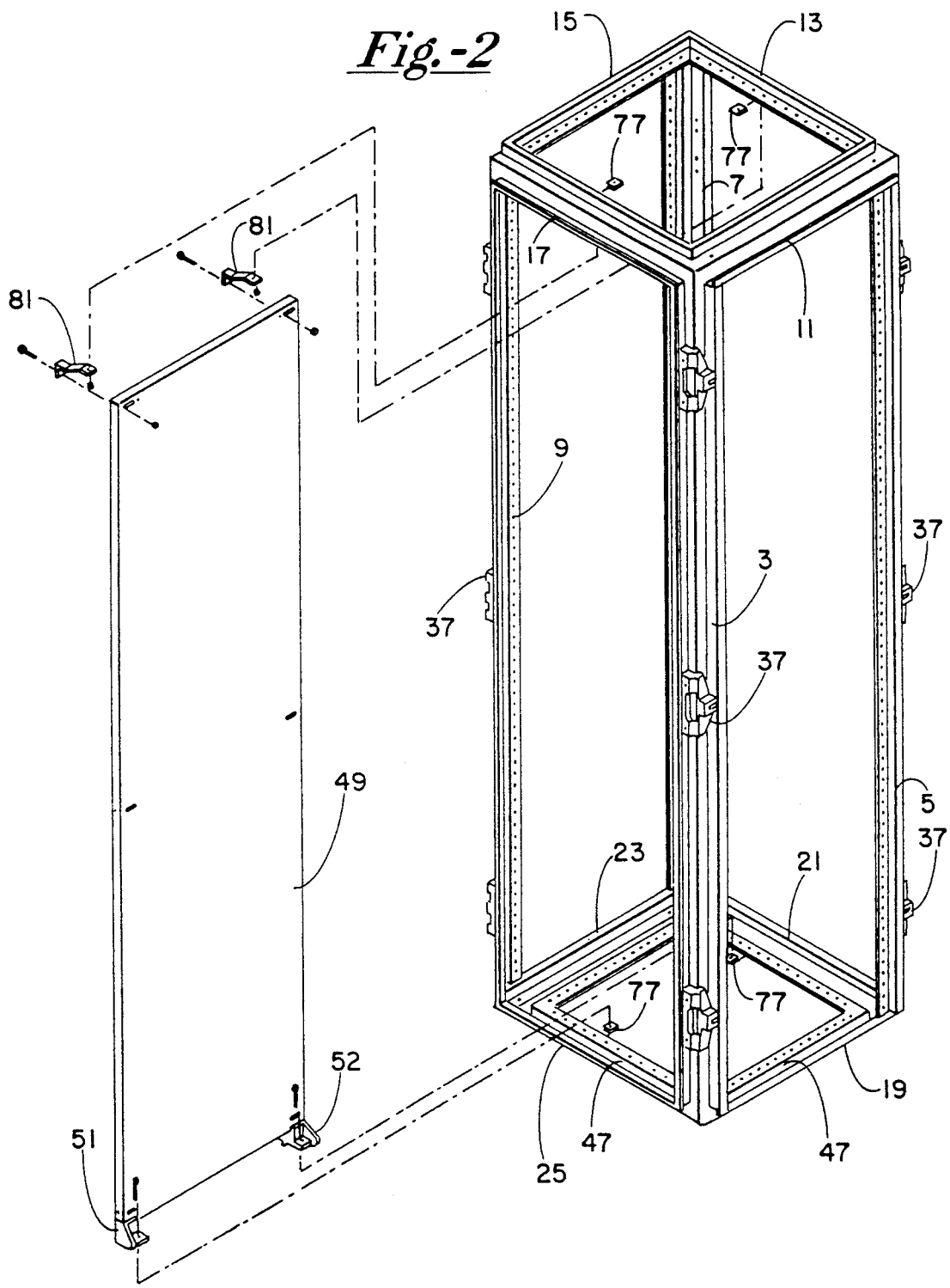
FIG. 2 is a perspective view of an electrical enclosure frame with a sub-panel mounting board exploded therefrom, wherein the sub-panel mounting board is orientated for installation in a sideways manner, relative to the orientation of the sub-panel mounting board shown in FIG. 1B.

Alternatively, as shown in FIG. 2, mounting board 49 may be rotated 90° in either direction and installed within enclosure frame 1 in such a position that the channel followers 51 and 52 on the lower corners of mounting board 49 will travel and be guided within the respective channel members 39 in lower cross frame sections 21 and 25. In such case, the depending traveler leg 63 of each respective channel follower 51 and 52 will travel within the opposite parallel channel segments of continuous channel guide 47, which are defined by lower cross frame sections 21 and 25.

As illustrated best in FIGS. 5 and 6, mounting board 49 is tilted forward as it is installed within modular enclosure frame 1, thereby causing each channel follower 51 and 52 to tilt forward onto apex or bearing surface 65 of its respective depending traveler leg 63. As mounting board 49 is moved interiorly into enclosure frame 1, apex 65 of each channel follower 51 and 52 bears against and glides along webbed portion 45 of the channel member 39 within which it travels. By tilting mounting board 49 forward, mounting shoulder 67 of each channel follower 51 and 52 becomes vertically spaced from mounting flange 45 of the lower cross frame section within which it travels. Thus, mounting board 49 is guided solely by the inter-engagement of the depending traveler legs 63 of channel followers 51 and 52 within the channel members 39 of the respective lower cross frame sections within which they travel.

As shown best in FIG. 7, once mounting board 49 is positioned at a desired location within modular enclosure frame 1, it is tilted upright to facilitate connection of channel followers 51 and 52 to the respective mounting flanges 69 of the lower cross frame sections within which they travel. As described previously, bolt 75 extends through opening 73 in mounting shoulder 67 of each channel follower, and into clip nut 77, which straddles mounting flange 69 in communicating relation with a mounting hole 71 therein. In such position, depending legs 63 of channel followers 51 and 52 become spaced from web 45 of the channel members 39 within which they travel. FIG. 7 illustrates the connection of channel follower 51 to lower cross frame section 23, it being understood that channel follower 52 connects to its associated lower cross frame section in an identical manner.

As shown throughout the various drawings, each channel follower 51 and 52 includes a relatively small locking lug 79 which extends downwardly from mounting shoulder 67. It is noted that locking lug 79 depends from mounting shoulder 67 adjacent its inner edge, in inwardly spaced relation from depending traveler leg 63. Locking lug 79 is also spaced rearwardly of the front edge of shoulder 67.

As shown in FIG. 8, by installing and sliding mounting board 49 to its rearmost position within the enclosure, locking lug 79 of each channel follower 51 and 52 will extend into channel member 39 of the rear cross frame section, which extends between the opposite parallel lower cross frame sections within which channel followers 51 and 52 travel. For example, with mounting board 49 installed within enclosure frame 1 in the orientation shown in FIG. 1B and FIG. 8, locking lug 79 of each channel follower 51 and 52 will extend into the channel member 39 of rear lower cross frame section 21, when mounting board 49 is disposed in the rearmost position within enclosure frame 1. If mounting board 49 is installed within enclosure frame 1 in the orientation shown in FIG. 2, locking lug 79 of each channel follower 51 and 52 will extend into channel member 39 of lower cross frame section 23 when mounting board 49 and channel followers 51 and 52 are slid to their rearmost position within their respective parallel channel segments of continuous guide channel 47.

As can be seen in FIG. 8, when locking lug 79 extends into channel member 39 of an associated lower cross frame section, mounting board 49 is prevented from any substantial slidable movement in any horizontal direction. As such, in this position, it is self-locking, thereby avoiding the need for bolting each channel follower to its associated mounting flange 69.

As shown in FIG. 1B, once mounting board 49 has been installed within enclosure frame 1 in a desired position, brackets 81, which are carried by mounting board 49 at the upper corners thereof, may be secured to mounting flange 69 of upper cross frame sections 11 and 15. Similarily, by orientating mounting board 49 as shown in FIG. 2, brackets 81 may be secured to mounting flange 69 of upper cross frame sections 13 and 17. In such manner, mounting board 49 may be secured at any desired location within enclosure frame 1 at both its upper and lower ends.

Although not shown, it is evident from the construction of enclosure frame 1, which is comprised of a plurality of identically configured frame sections, that channel followers 51 and 52 can also be mounted on the upper corners of mounting board 49, whereby the depending traveler leg 63 thereof will then travel within the inverted channel members 39 of the upper cross frame sections 11, 13, 15 and 17, depending upon the orientation of mounting board 49.

From the foregoing disclosure, it is evident that our unique sub-panel guide system provides ease of installation, alignment and positioning of internal sub-panel mounting boards within electrical enclosures. By forming an integral guide channel around the inner periphery of the lower base frame sections of the enclosure frame 1, a highly versatile guide system which provides installation of such mounting boards in a plurality of orientations is formed. By forming such a guide system integrally with the lower cross frame sections of enclosure frame 1, ease in manufacturing and assembly is achieved. The use of a relatively large depending traveler leg 63 on each channel follower 51 and 52, which extends into a relatively deep guide channel 47, provides ease of use and reliability to our unique sub-panel guide system, which is not provided by conventional enclosures of this type.

It will, of course, be understood that various changes may be made in the form, details, arrangement and proportions of the parts without departing from the scope of the invention which comprises the matter shown and described herein and set forth in the appended claims.

I claim:

1. An enclosure with a sub-panel guide system for proper installation and positioning of sub-panel mounting boards within the enclosure, comprising:
   (a) a generally rectangular free-standing enclosure with an open interior and lower interior peripheral portions, said enclosure having opening-defining portions through which at least one sub-panel mounting board having upper and lower ends is received within said interior of said enclosure, said enclosure including a continuous channel member extending around said lower interior peripheral portions of said enclosure;
   (b) a pair of channel followers mounted on said lower end of said sub-panel mounting board, said channel followers being constructed and arranged in cooperative guided inter-engagement with said channel member to facilitate proper alignment and installation of said sub-panel mounting board within said enclosure; and
   (c) each of said channel followers having a depending leg portion which extends downwardly into said channel member and outwardly from said mounting board to provide a sliding support which engages said channel member in slidable relation upon tilting of said mounting board.

2. The structure defined in claim 1, wherein said channel member includes means for installing said sub-panel mounting board within said enclosure in any one of a plurality of orientations, said channel followers remaining in cooperative guided inter-engagement within said channel member for each said orientation of said sub-panel mounting board.

3. The structure defined in claim 2, wherein each of said channel followers includes means for lockably engaging said channel member at any one of a plurality of locations.

4. The structure defined in claim 2, wherein said channel member defines a rectangular path having two pair of interconnected opposite parallel channel segments, one pair of said parallel channel segments receiving said channel followers in guiding relation for at least one orientation of said mounting board, and said second pair of said parallel channel segments receiving said channel followers in guiding relation for at least one other orientation of said mounting board.

5. The structure defined in claim 1 wherein said channel member is integrally formed with said enclosure.

6. The structure defined in claim 1, wherein each of said channel followers includes a depending locking member which is constructed and arranged to engage said channel member in locking relation and prevent slidable movement of said mounting board upon predetermined positioning of said mounting board within said enclosure.

7. The structure defined in claim 4, wherein each of said channel followers includes a depending locking member which engages said channel member in locking relation when said mounting board is positioned in a location within said enclosure where each of said channel followers are adjacent a juncture between said two pair of interconnected channel segments.

8. An enclosure with a sub-panel guide system for proper installation and positioning of sub-panel mounting boards within the enclosure, comprising:
   (a) an enclosure with an open interior and inner peripheral portions, said enclosure having a generally rectangular enclosure frame which defines a plurality of front, back and side openings over which associated front, back and side wall panels are disposed and connected to said frame, at least one of said openings providing means by which at least one sub-panel mounting board having upper and lower ends is received within said interior of said enclosure, said frame including a plurality of lower base frame sections which form a rectangular guide channel around said inner peripheral portions of said enclosure;
   (b) a pair of spaced channel followers mounted to said lower end of said mounting board, each of said channel followers being constructed and arranged in cooperatively inter-engaging guided relation with opposite parallel segments of said rectangular guide channel when said mounting board is installed within said enclosure; and
   (c) said mounting board being positionable within said enclosure in any one of a plurality of orientations such that said channel followers travel freely within said guide channel between opposite extreme ends of said segments which guide said channel followers.

9. The structure defined in claim 8, wherein each of said channel followers has a depending traveler leg which extends downwardly into said guide channel and outwardly at an angle relative to said mounting board, said leg providing a slidable support which engages a bottom portion of said guide channel in slidable relation upon predetermined directional tilting of said mounting board.

10. The structure defined in claim 8, wherein each of said channel followers includes a depending locking lug which is constructed and arranged to extend within said guide channel and prevent slidable movement of said mounting board when said mounting board is disposed in a location such that said channel followers are disposed adjacent said extreme ends of said segments which are opposite said opening within which said mounting board is received.

11. The structure defined in claim 8, wherein said rectangular guide channel comprises a first pair of spaced parallel channel segments interconnected at adjacent ends by a second pair of spaced parallel interconnecting channel segments to define a continuous path around said inner peripheral portions of said enclosure, said channel followers being constructed and arranged to travel in guided relation within said first or second pair of parallel channel segments, depending on the orientation of said mounting board.

12. The structure defined in claim 11, wherein each of said channel followers includes a depending locking member which extends into one of said interconnecting channel segments between said pair of parallel channel segments within which said channel followers travel when said mounting board is positioned such that said channel followers are disposed adjacent to where said interconnecting channel segments and said parallel channel segments meet.

13. The structure defined in claim 8, wherein each of said channel followers has a depending traveler leg which is generally triangular in shape and extends downwardly and outwardly into said guide channel within which said channel follower travels to form an apex upon which said mounting board is slidably supported when said mounting board is tilted in a predetermined direction during installation within said enclosure.

14. The structure defined in claim 8, wherein each of said channel followers includes means for lockably engaging said channel segment within which said channel follower travels at any one of a plurality of locations along the length of said channel segment.

* * * * *